(12) United States Patent
Bansal et al.

(10) Patent No.: US 8,354,879 B2
(45) Date of Patent: Jan. 15, 2013

(54) POWER SWITCH FOR DECREASED RAMP RATE

(75) Inventors: Mukesh Bansal, Cheeka (IN); Kumar Abhishek, Ghaziabad (IN); Shubhra Singh, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 134 days.

(21) Appl. No.: 13/004,045

(22) Filed: Jan. 11, 2011

(65) Prior Publication Data

US 2012/0176188 A1   Jul. 12, 2012

(51) Int. Cl.
*G05F 1/10* (2006.01)
(52) U.S. Cl. .......................... 327/541; 327/108
(58) Field of Classification Search .............. 327/108, 327/109, 111, 379, 381, 403, 404, 405, 540, 327/541

See application file for complete search history.

(56) References Cited

U.S. PATENT DOCUMENTS

| | | | |
|---|---|---|---|
| 4,319,199 A | | 3/1982 | Sunderland |
| 5,801,572 A | * | 9/1998 | Nakamura |
| 5,952,869 A | * | 9/1999 | Fattori et al. |
| 7,142,044 B2 | * | 11/2006 | Sano |
| 7,183,816 B2 | * | 2/2007 | Martelloni |
| 7,573,287 B2 | * | 8/2009 | Rabenstein et al. |
| 8,193,855 B2 | * | 6/2012 | Kawasaki |
| 2007/0207681 A1 | | 9/2007 | Zabroda |
| 2008/0232012 A1 | | 9/2008 | Chu |
| 2008/0246345 A1 | | 10/2008 | Zecri |

* cited by examiner

*Primary Examiner* — Jeffrey Zweizig
(74) *Attorney, Agent, or Firm* — Charles Borgere

(57) ABSTRACT

A power switch for an integrated circuit provides a stepped profile supply potential. A supply potential generation block generates the stepped profile output supply to control the ramp rate of the output in order to prevent a false trigger of electrostatic discharge at the pads of the integrated circuit.

17 Claims, 6 Drawing Sheets

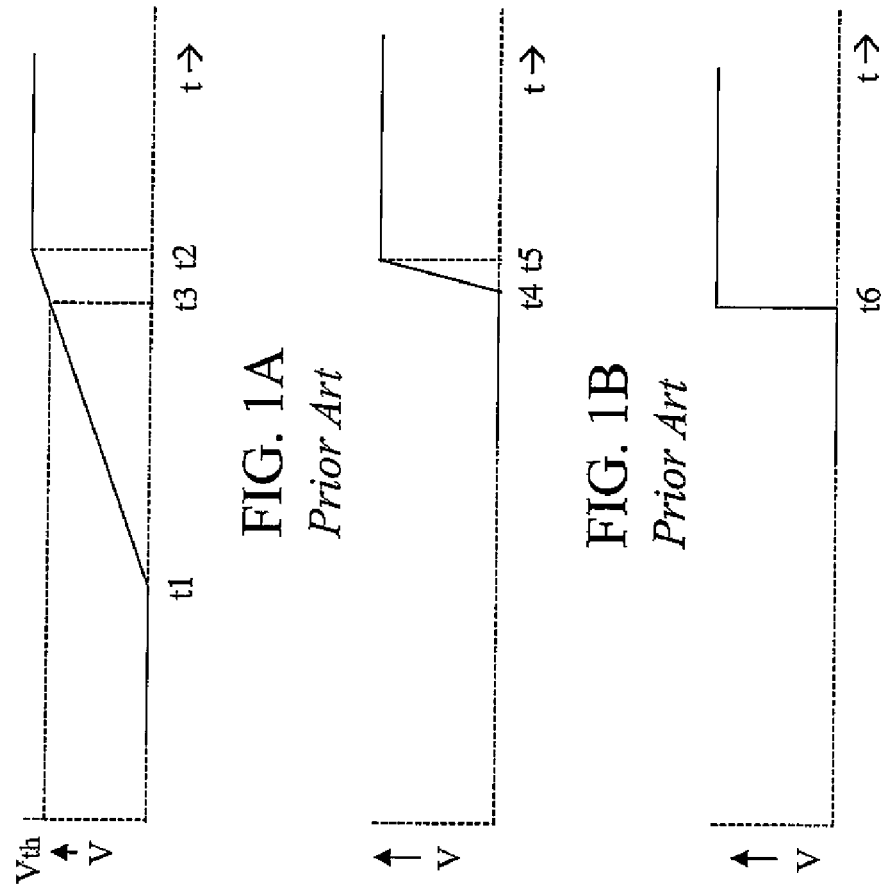
FIG. 1A
*Prior Art*
FIG. 1B
*Prior Art*
FIG. 1C
*Prior Art*
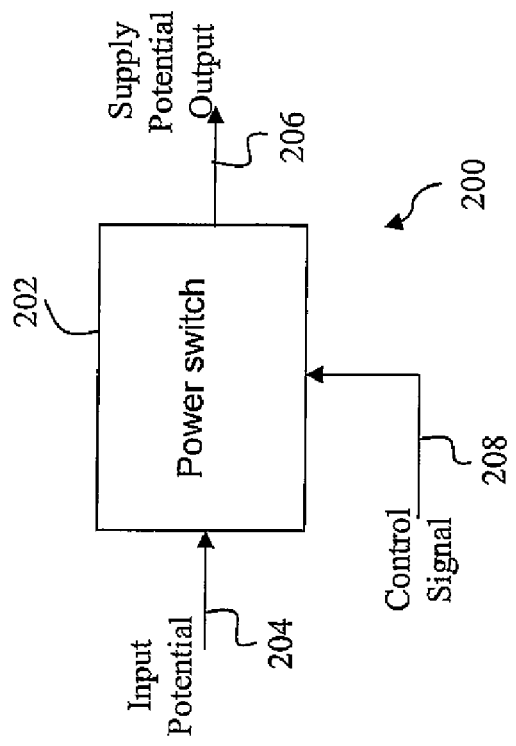
FIG. 2

POWER SWITCH FOR DECREASED RAMP RATE

BACKGROUND OF THE INVENTION

The present invention relates generally to an input power supply for an integrated circuit and more particularly, to a power switch for preventing a false electrostatic discharge (ESD) trigger in an input/output pad of an integrated circuit.

Recently, there has been a lot of development in the field of Integrated Circuit (IC) devices. The rapidly decreasing size of these devices has led to the development of System on Chip (SoC) designs. A SoC can be referred to as a system in which all the components of an electronic device are integrated on a single IC. These SoC designs can be packaged in various ways, where each package is designed for a particular function. This helps reduce cost as the same die can be sold in different packages, some with limited pin count.

Low power SoC designs as well as multi-package options have led to switchable supply requirements becoming an important consideration. Traditionally, the nonfunctional I/O segments of an IC were left unpowered. However, this resulted in significant loss of desired functionality of the device. Further, powering each I/O segment in an IC is avoided due to limitations in pin count and other packaging constraints.

Power switches may be used for providing power to the I/O segment, but these power switches operate on a resistive start-up, which is not ideal for use as I/O supply due to a fast ramp rate of the output potential. The fast ramp rate can activate a false trigger of the electrostatic discharge circuitry present within the pads of the IC, resulting in a large power loss. FIGS. 1A, 1B AND 1C illustrate the behavior of a traditional power switch, in particular the voltage-time characteristics of an input supply, an output supply and a control signal. The input signal, as illustrated in FIG. 1A, is a ramp signal that starts at time t1 and attains a maximum value at time t2. At time t3, the input reaches a threshold value $V_{th}$, which triggers the power switch. When triggered, the power switch produces the output signal at time t4 as shown in FIG. 1B. A control signal, as illustrated in FIG. 1C, is activated externally to determine the threshold $V_{th}$. The output signal generated by the power switch ramps up at a fast rate to attain its maximum value at t5. The short duration (t4-t5) of the ramp up of output voltage can cause a false trigger due to ESD. The size of a power switch may be reduced to prevent the false trigger, but this reduces the drive capability and cause the output to drop when in operation.

It would be advantageous to have a switch that provides an output supply potential to the IC and prevents generation of a false trigger due to electrostatics discharge. It also would be advantageous if the power switch has good drive capability to ensure that the output does not drop during operation.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 1A is a timing diagram illustrating variation of an input potential of a conventional power switch;

FIG. 1B is a timing diagram illustrating variation of an output potential of the conventional power switch;

FIG. 1C is a timing diagram illustrating variation of a control input of the conventional power switch;

FIG. 2 is a schematic block diagram of an exemplary environment in which various embodiments of the present invention may be practiced;

DETAILED DESCRIPTION OF THE INVENTION

Figure 3:
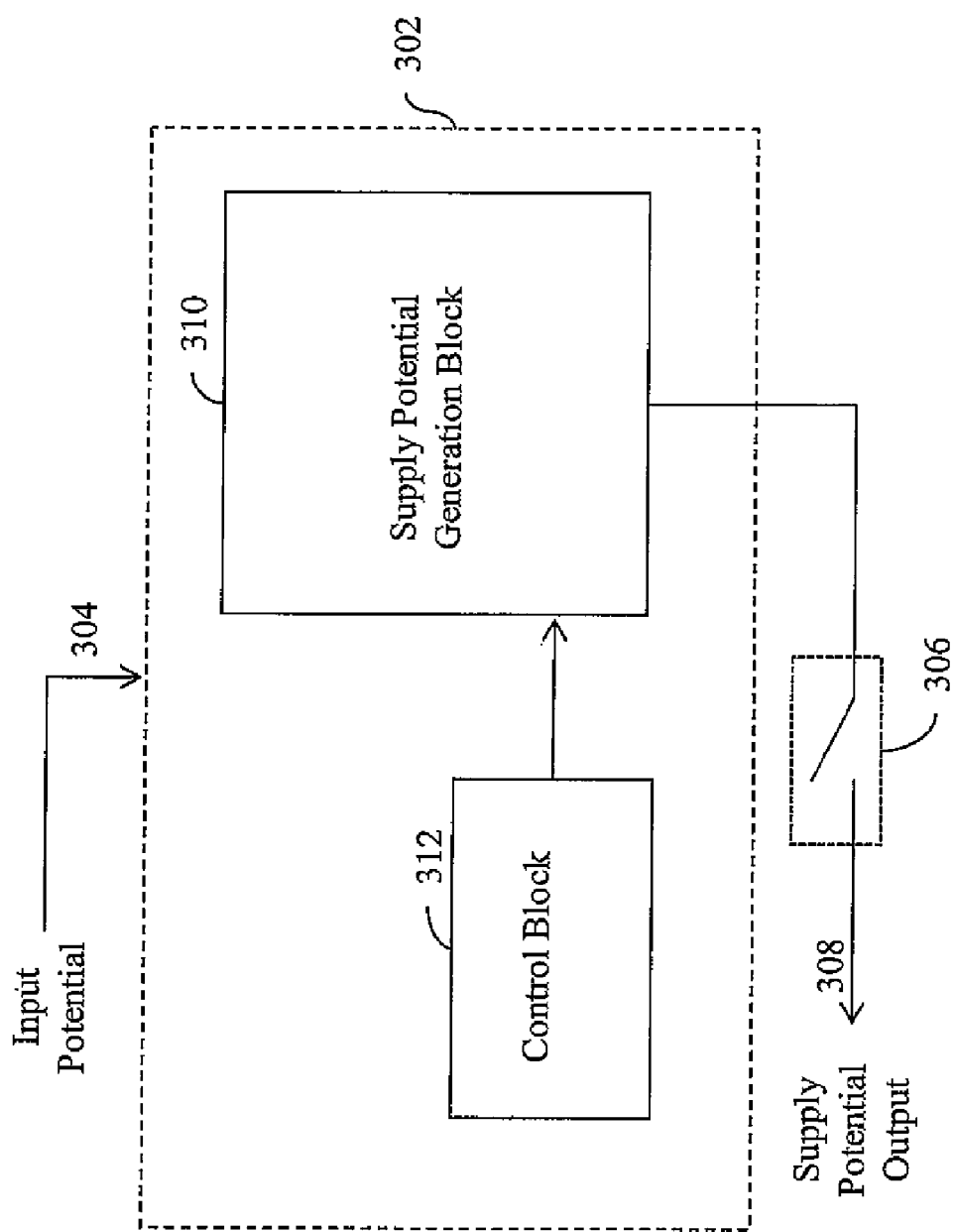
FIG. 3 is a schematic block diagram illustrating system elements for generating a stepped profile supply potential for an integrated circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for generating a stepped profile supply potential for an integrated circuit includes a supply potential generation block and a control block. The supply potential generation block includes a first plurality of switching devices that are connected in a predetermined manner to generate the stepped profile supply potential. The stepped profile can be characterized by a predetermined step size and predetermined step duration for each step. The control block generates a plurality of control signals that are provided to the supply potential generation block. The control signals determine the predetermined step duration of the stepped profile supply potential.

In another embodiment of the present invention, a system for providing a switchable supply potential for an integrated circuit is provided. The system includes an input power supply, a first power switch, a second power switch and a comparator circuit. The first power switch is connected to the input power supply and generates a first switchable supply potential. The second power switch is also connected to the input power supply and generates a second switchable supply potential with a stepped profile. Further, the comparator circuit is connected to the first power switch, the second power switch, and the input power supply. The comparator circuit switches between the first and second switchable supply potentials based on a predetermined criterion to generate the desired switchable supply potential.

In accordance with another embodiment of the invention, a method for generating a stepped profile supply potential for an integrated circuit is provided. The method includes generating a plurality of control signals by a control block. The control signals enable switching of at least one of a first plurality of switching devices of a supply potential generation block, wherein each of the plurality of switching devices is connected in a predetermined manner. The method further involves generating a stepped profile supply potential with the supply potential generation block. The stepped profile can further be characterized by a step size and a step duration. The step size corresponds to a potential drop across a switching device and the step duration is determined in accordance with the control signals.

The systems and method described above facilitate a reduction in the number of power pins in integrated circuits with pad limited designs. Further, each of the I/O segments of the IC can be connected to prevent any loss in functionality. In addition, the system can be used with a conventional power switch to ensure good drive and that the output does not droop under run conditions. The system also can be used in a System on Chip (SoC) to provide improved power sequencing. The system may be enabled or disabled based on the requirements of a particular package.

In accordance with the present invention, a system for generating a stepped profile supply potential for an integrated circuit (IC) is provided. FIG. 2 is a schematic block diagram of an exemplary environment in which various embodiments of the present invention may be practiced. The system 200 illustrates a power switch 202 that receives an input potential 204 and provides a supply potential 206 to a switchable Input/output (I/O) segment (not shown in the FIG.) of an integrated circuit. The power switch 202 may be used to supply a switchable I/O segment with an input potential that is different from the input potential supplied to powered I/O segment.

Referring back to the characteristics illustrated in FIG. 1A, the power switch 202 is inactive at t1, when the input is ramping at a slow ramp rate as this may lead to undesired power output at the I/O segment, which may cause problems in a package where the input potential 204 and the supply potential output 206 are different. Hence, to overcome the above problems, the power switch 202 is activated in accordance with the requirements of the respective switchable I/O segment. In accordance with the invention, a control signal 208 is provided for activating or deactivating the power switch 202 in accordance with the package to which power is being supplied.

FIG. 3 is a block diagram illustrating a system 300 for generating a stepped profile supply potential for integrated circuits in accordance with an embodiment of the present invention. The system 300 includes a power switching system 302, an input potential 304, a supply potential output switch 306 and supply potential output 308. The power switching system 302 further includes a supply potential generation block 310 and a control block 312.

The power switching system 302 receives the input potential 304 and provides the supply potential output 308 through the supply potential generation block 310. In accordance with one embodiment of the invention, the supply potential generation block 310 includes a plurality of switching devices. In various embodiments, the switching devices may include NMOS devices, PMOS devices, transistors, diodes or other switching devices. Each of the plurality of switching devices may be connected in a predetermined manner to obtain an output having a stepped profile. The configuration and internal connections of the supply potential generation block 310 will be discussed in greater detail in conjunction with FIG. 4. The switching devices are controlled by control signals provided by the control block 312. The control signals switch the switching devices and hence determine the step duration of the stepped profile of the output 308. A potential drop across each of the plurality of switching devices determines the step size of the stepped profile supply potential.

Figure 4:
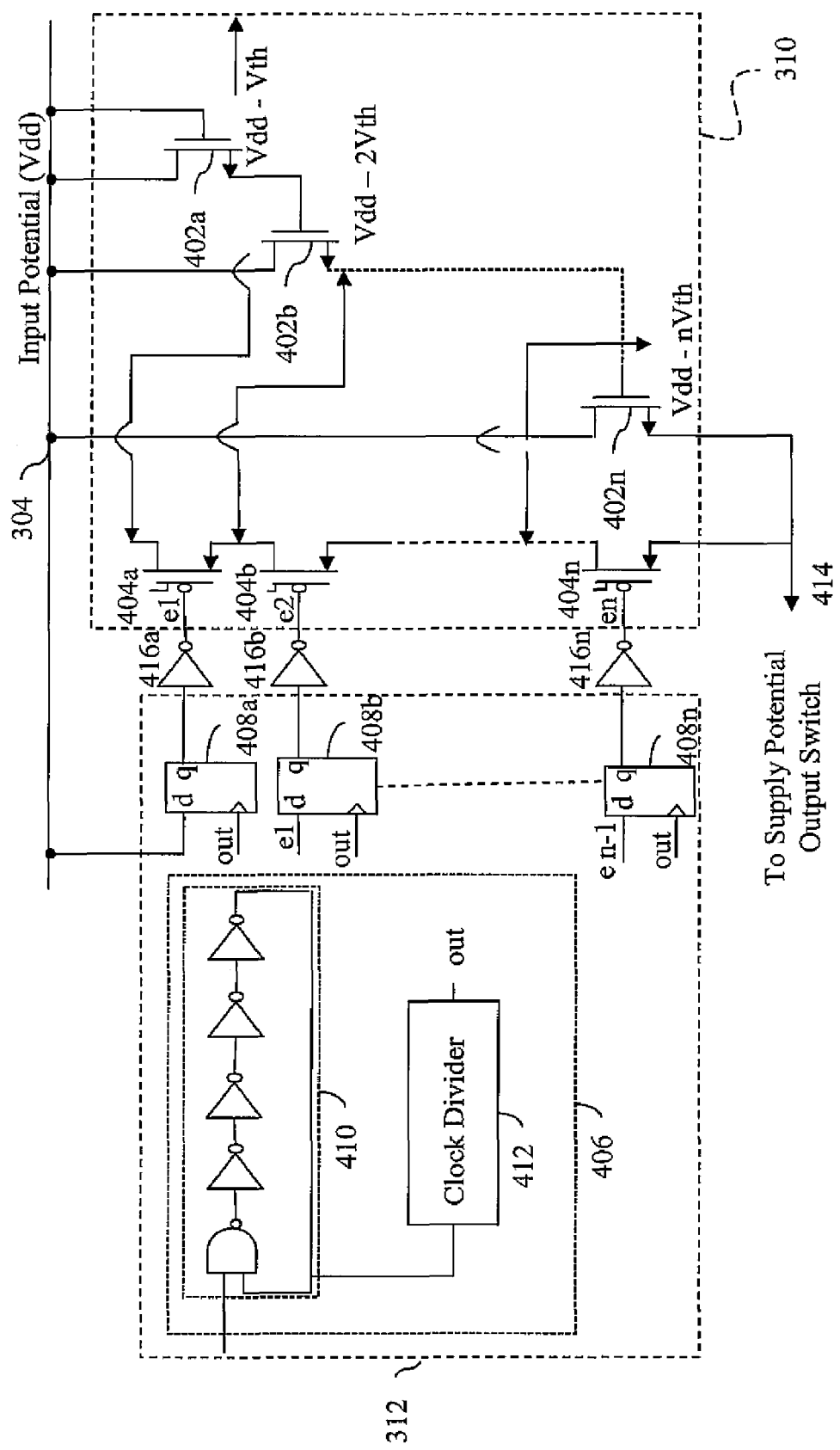
FIG. 4 is a schematic block diagram illustrating a supply potential generation block and a control block in accordance with an embodiment of the present invention.

FIG. 4 is a schematic block diagram illustrating the supply potential generation block 310 and the control block 312 of FIG. 3 in accordance with an embodiment of the present invention. The supply potential generation block 310 includes a first plurality of switching devices 402a, 402b, to 402n (referred to collectively as 402) and a second plurality of switching devices 404a, 404b, to 404n (referred to collectively as 404). The control block 312 includes a clock generation circuit 406 and a plurality of flip flops 408a, 408b to 408n (referred to collectively as 408). The clock generation circuit 406 includes a ring oscillator 410 and a clock divider 412. The supply potential generation block 310 receives input power from the input potential 304 (i.e., Vdd) and provides the supply potential output 414 to the supply potential output switch 306. In one embodiment, the output of the flip flops 408 is inverted with a set of inverters 416. The inverted outputs are used as inputs for the second plurality of switching devices 404.

The first plurality of switching devices 402 may include PMOS devices, NMOS devices, transistors, diodes or other switching devices. In one embodiment of the invention, as shown in FIG. 4, each of the first plurality of switching devices 402 is an NMOS device. The NMOS devices are connected in series such that the source of NMOS device is connected to the gate of the subsequent NMOS device and so on. Further, as illustrated, the drain of each of the plurality of NMOS devices is connected to the input potential 304. In one embodiment of the invention, the second plurality of switching devices 404 is used for switching each of the first plurality of switching devices 402. The second plurality of switching devices 404 may include PMOS devices, NMOS devices, transistors, diodes or other switching devices. In an embodiment of the invention, PMOS devices are employed as the switching devices in the second plurality of switching devices 404 and are controlled using control signals e1, e2 to en. Signals e1, e2 to en are obtained by inverting the output of the flip-flops 408a, 408b to 408n. Each of the second plurality of switching devices 404 switch the first plurality of switching devices 402 respectively, in accordance with the control signals e1, e2, to en. In another embodiment of the present invention, NMOS switching devices can be used for second plurality of switching devices (not shown in FIG. 4). In such an embodiment, inverters need not be connected to the flip flops 408 and the outputs of the flip flops 408 are provided directly to the second plurality of switching devices 404.

The control block 312 includes a clock generation circuit 406 for generating a clock signal. The frequency of the clock signal is determined by the ring oscillator 410 and the clock divider circuit 412. The clock signal is provided to the clock input of the flip flops 408. In one embodiment of the invention, each of the plurality of flip flops 408 is a delay flip flop. The plurality of flip flops 408 is connected in series such that the output of each flip flop is provided to the input of a subsequent flip flop and the first flip flop 408a receives an input from the input potential 304. The series connection enables generation of the control signals e1 to en at fixed intervals, the fixed interval being determined by the frequency of the clock signal generated by the clock generation circuit 406.

Each of the plurality of flip flops 408 also is controlled by a reset control signal (not shown). The reset control signal ensures that when the switch is inactive, the output of each of the flip flops 408 is 0 and hence each of the switching devices of the second plurality of switching devices 404 is open. The frequency of the clock signal is determined by an ESD trigger timeout time. The ESD trigger timeout is a time interval for which the ESD trigger is active before it finally dies out. The switch control is spaced in accordance with ESD trigger timeout to ensure that every voltage step is spaced apart sufficient for any minor ESD trigger to subside before the next step arrives.

Figure 5A:
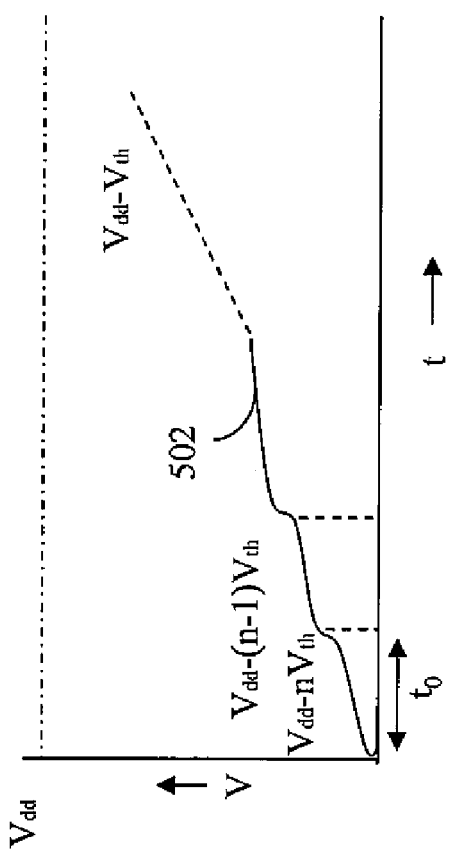
FIG. 5A is a timing diagram illustrating a supply potential output profile of a supply potential generation block in accordance with an embodiment of the present invention.
Figure 5B:
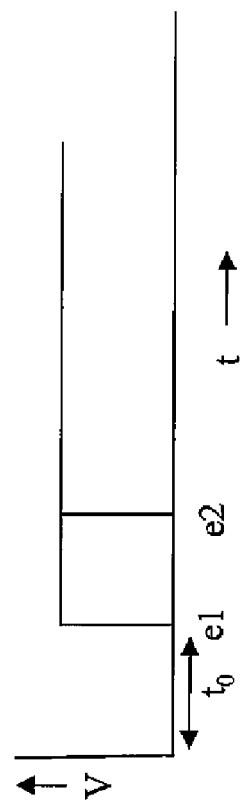
FIG. 5B is a timing diagram illustrating a control signal output of a control block in accordance with an embodiment of the present invention.

FIG. 5A is a timing diagram illustrating the supply potential output profile of the supply potential generation block 310 and FIG. 5B is a timing diagram illustrating the control signal output of the control block 312.

At t=0, each of the plurality of switching devices 402 are switched ON. The supply potential output 414 at this stage is equal to a potential drop across n NMOS devices and can be represented as:

$$V_{outi} = V_{dd} - nV_{th};$$

where $V_{th}$ is the threshold potential across each of the plurality of NMOS devices in an ON state. The number n of switching devices is fixed such that the above value $V_{outi}$=0.

At t=$t_0$, the control block 312 generates a control signal e1 by activating the flip flop 408a. The control signal e1 enables switching OFF of the NMOS device 402a, and enables generation of a potential drop $V_{out}=V_{dd}-(n-1)V_{th}$, as represented in FIG. 5A, at the supply potential output 308.

FIG. 5B illustrates the generation of control signals e2, e3, to en during subsequent intervals of duration $2t_0$, $3t_0$ and so on. Corresponding to the control signals e2, e3, to en, each of the plurality of n switching devices is switched OFF one by one, at regular intervals of $t_0$, resulting in a supply potential output 308 is illustrated by curve 502 in FIG. 5A. The output potential at any time $pt_0$ can be defined as $V_{out}=V_{dd}-(n-p)V_{th}$, where p relates to switching OFF of the first p switching devices.

Figure 6:
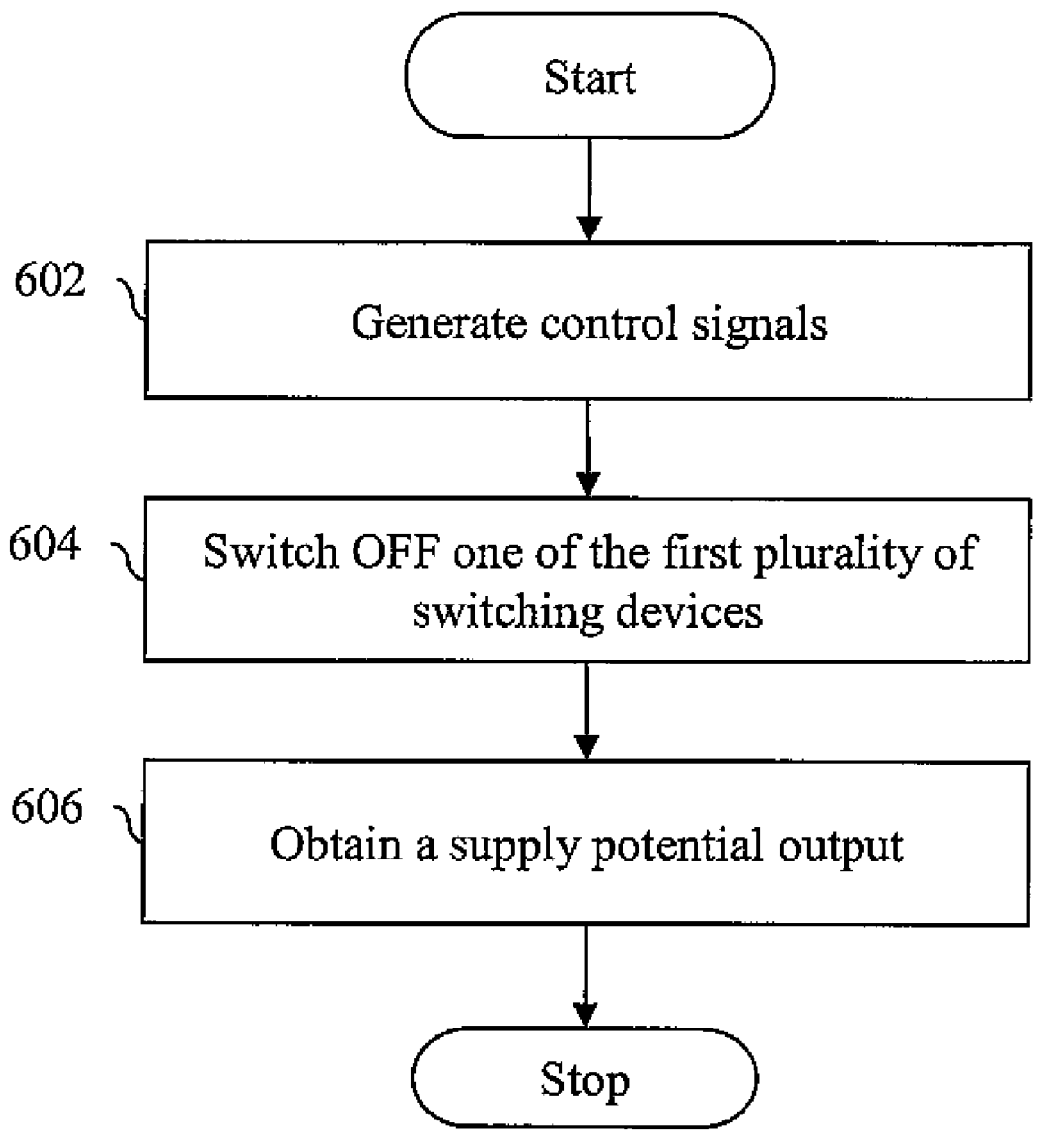
FIG. 6 is a flowchart illustrating the generation of a stepped profile supply potential for an integrated circuit in accordance with an embodiment of the present invention.

Referring now to FIG. 6, a flowchart illustrating a method for generating a stepped profile supply potential for an integrated circuit in accordance with an embodiment of the present invention is shown. At a first step 602, the control block 312 generates the control signal e1 at time t=$t_0$. The duration t=$t_0$ is determined by the clock generation circuit 406, which generates a clock signal. The clock signal enables the flip flop 408a to generate a first one of the plurality of control signals. As previously discussed, the plurality of NMOS devices 402a, 402b to 402n are initially switched ON such that there is a potential drop of $V_{dd}-nV_{th}=0$ at the output of the supply generation block. At step 604, the control signal e1 enables the switching OFF of one of the first plurality of switching devices. In an embodiment of the invention, the control signal e1 enables the first PMOS switching device 404a of the second plurality of switching devices, which further enables the switching OFF (bypass) of the first NMOS switching device 402a of the first plurality of switching devices. At step 606, the output supply potential $V_{out}=V_{dd}-(n-1)V_{th}$ is obtained at the output supply potential switch 306 in accordance with the switching OFF of the first NMOS switching device 402a of the first plurality of switching devices 402. The above steps are repeated with the generation of a subsequent control signal e2 at a time $2t_0$ and so on. With subsequent switching OFF of the switching devices 402b, 402c to 402n, the output signal continues to increase in accordance with the stepped profile as already discussed in conjunction with FIGS. 5A and 5B.

Figure 7:
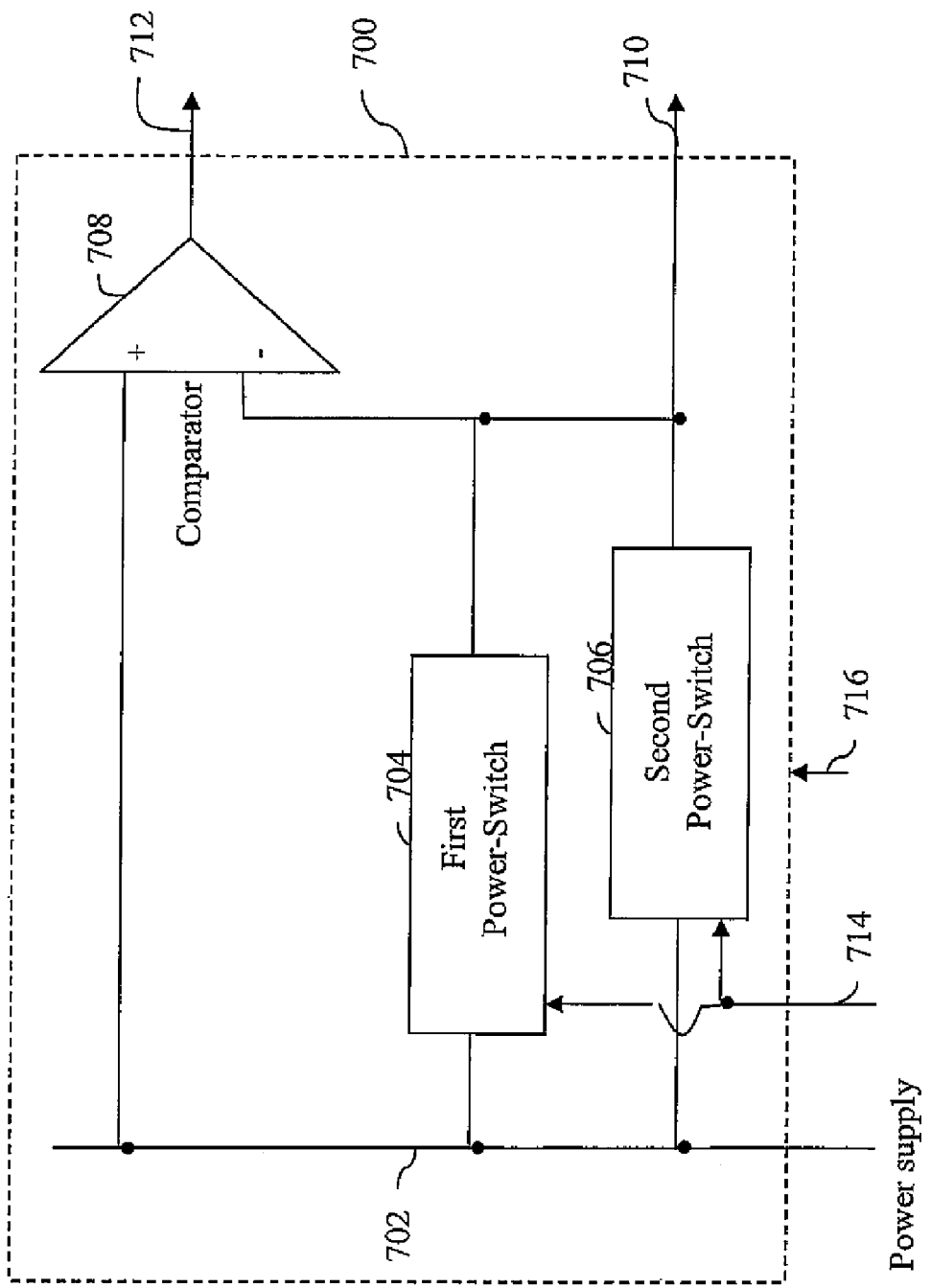
FIG. 7 is a schematic block diagram illustrating system elements for providing a switchable supply potential for an integrated circuit in accordance with another embodiment of the present invention.

FIG. 7 is a block diagram illustrating a power switch 700 for providing a switched output potential for input to an integrated circuit in accordance with an embodiment of the present invention. The power switch 700 includes an input power supply 702, a first power switch 704, a second power switch 706, a comparator 708, a switchable supply potential output terminal 710, a comparator output terminal 712, a comparator output supply terminal 714, and a package decode input terminal 716.

In one embodiment of the invention, the first power switch 704 represents a conventional power switch and exhibits characteristics discussed in reference with FIGS. 1A, 1B and 1C. The first power switch 704 receives an input from the input power supply 702 and provides an output to an input terminal of the comparator 708 and the switchable supply potential output terminal 710. The second power switch 706 exhibits stepped output characteristics as illustrated in FIG. 5A. The second power switch 706 receives an input from the input power supply 702 and provides an output to another input terminal of the comparator 708 and also to the switchable supply potential output terminal 710. The comparator 708 is connected to the first output switch 704, the second output switch 706 and the input power supply 702.

The comparator 708 compares the inputs received from at least one of the first and second power switches and the power supply 702 and generates a comparator output (compout) 712. Compout is provided to the power switch 700 at the comparator output supply terminal 714. Note, compout also could be provided with a signal route directly to the first and second power switches 704, 706 instead of via a terminal like the terminal 714. In one embodiment of the invention, compout is active when the input received from at least one of the first and second power switches exceeds a predetermined threshold $V_{th2}$. When the input is below the predetermined threshold potential $V_{th2}$, compout is inactive. In this case, the first power switch 704 is inactive and the switchable supply potential output terminal 710 is operated in accordance with the active second power switch 706. Further, when the comparator input is above the threshold potential $V_{th2}$, compout is active. In this case, the first power switch 704 is activated and the second power switch 706 is turned OFF. The switchable supply potential output terminal 710 is then operated in accordance with the active first power switch 704.

In one embodiment of the invention, the power switch 700 further includes a package decode input terminal 716 for receiving a package decode bit. The package decode bit contains information to activate the power switch 700 and is further stored in an external memory. In an embodiment of the invention, an active package decode bit activates the power switch 700 to generate a controlled output at the switchable supply potential output terminal 710. In another embodiment of the invention, an active package decode bit disables the power switch 700 and the integrated circuit I/O segment is operated directly from the power supply 702.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for generating a stepped profile supply potential for an integrated circuit that receives an input potential, the system comprising:

a supply potential generation block for generating the stepped profile supply potential using the input potential, wherein the supply potential generation block includes a first plurality of switching devices arranged to generate the stepped profile supply potential, the stepped profile having a predetermined step size that is a potential drop across each of the first plurality of switching devices equivalent to a threshold voltage of the switching device, and a predetermined step duration for each step; and a control block, connected to the supply potential generation block, for generating a plurality of control signals that are provided to the supply potential generation block, wherein the control signals determine the predetermined step duration.

2. The system of claim 1, wherein the supply potential generation block includes a second plurality of switching devices that enable switching of the first plurality of switching devices based on the control signals, wherein the switching devices of the second plurality of switching devices are connected serially, with a source terminal of each switching device connected to a drain terminal of a subsequent switching device and a gate terminal of each switching device receiving a respective one of the control signals generated by the control block, wherein the drain terminal of each switching device provides a switching signal at the source terminal of a switching device of the first plurality of switching devices.

3. The system of claim 2, wherein the first plurality of switching devices are connected in series, the series connection comprising a connection between a source of one switching device and a gate of a subsequent switching device and a connection of a drain of each of the first plurality of switching devices to the input potential, wherein the first plurality of switching devices is provided a plurality of switching signals from the second plurality of switching devices, wherein each switching device at a serial order in the second plurality of switching devices provides the switching signal to the switching device at the same serial order in the first plurality of switching devices.

4. The system of claim 1, wherein the control block comprises a clock generation circuit and a plurality of series connected flip flops, wherein an output of one flip flop is connected to an input of a subsequent flip flop.

5. The system of claim 4, wherein the outputs of each of the plurality of flip flops generates one of the control signals that is provided to the supply potential generation block for controlling the step duration of the predetermined output voltage.

6. The system of claim 4, wherein the clock generation circuit generates a clock signal for each of the plurality of control signals in accordance with a predetermined profile.

7. The system of claim 4, wherein the clock generation circuit further comprises a ring oscillator connected to a clock divider, the clock divider providing an input to a clock terminal of each of the plurality of flip flops.

8. The system of claim 1, further comprising a supply potential output switch, connected to the supply potential block, for supplying power to the integrated circuit.

9. A power switch for generating a supply potential having a decreasing, stepped ramp rate from an input potential, the power switch comprising:

a supply potential generation block that receives the input potential and generates a plurality of output supply voltages, the output supply voltages varying in magnitude by a predetermined amount; and a control block for generating a plurality of control signals that are provided to the supply potential generation block for controlling the magnitudes of the output supply voltages;

wherein the supply potential generation block includes a plurality of NMOS transistors connected in series to provide the varying output supply voltages.

10. A method for generating a stepped profile supply potential from an input potential, wherein the supply potential is provided to an integrated circuit, the method comprising:

generating a plurality of control signals with a control block;

switching one of a first plurality of switching devices of a supply potential generation block in response to one of the plurality of control signals, wherein each of the plurality of switching devices is connected in series; and generating the supply potential with the supply potential generation block, wherein generating the supply potential comprises generating a stepped profile supply potential, wherein the stepped profile has a size corresponding to a potential drop across a switching device of the first plurality of switching devices, and wherein the stepped profile further comprises a step duration determined by the plurality of control signals.

11. The method for generating a stepped profile supply potential of claim 10, wherein the control block comprises a clock generator and a plurality of flip flops, wherein the control signals determine the step duration of the stepped profile, the step duration being determined in accordance with a clock signal generated by the clock generator.

12. The method for generating a stepped profile supply potential of claim 11, wherein the first plurality of switching devices comprises one of a plurality of NMOS devices and a plurality of PMOS devices.

13. The method for generating a stepped profile supply potential of claim 11, wherein the switching devices provide a potential drop equivalent to a threshold voltage of the switching device.

14. The method for generating a stepped profile supply potential of claim 11, further comprising providing the control signals to a second plurality of switching devices for switching at least one of the first plurality of switching devices to at least one of a conductive state a conductive and a non-conductive state, the second plurality of switching devices comprising one of a plurality of NMOS devices and a plurality of PMOS devices.

15. The method for generating a stepped profile supply potential of claim 11, wherein connecting the first plurality of switching devices in a predetermined manner comprises connecting the first plurality of switching devices in series, wherein connecting the first plurality of switching devices in series comprises connecting a source of each switching device and a gate of subsequent switching device and further connecting a drain of each switching devices to the input potential, wherein each switching device is further provided with a switching signal at the drain.

16. The method for generating a stepped profile supply potential of claim 11, wherein generating a control signal further comprises connecting the plurality of flip flop in series, wherein the series connection enables providing an output of each flip flop to input of the subsequent flip flop.

17. The method for generating a stepped profile supply potential of claim of claim 16, further comprising providing an input to a clock terminal of each of the plurality of flip flops, the input being generated by a clock divider connected to a ring oscillator.

* * * * *